United States Patent [19]
Rosenquist

[11] Patent Number: 6,082,949
[45] Date of Patent: Jul. 4, 2000

[54] LOAD PORT OPENER

[75] Inventor: Frederick T. Rosenquist, Redwood City, Calif.

[73] Assignee: Asyst Technologies, Inc., Fremont, Calif.

[21] Appl. No.: 08/730,643

[22] Filed: Oct. 11, 1996

[51] Int. Cl.[7] .................................................. B65G 49/07
[52] U.S. Cl. ........................ 414/217; 414/416; 414/940
[58] Field of Search .................................... 414/217, 331, 414/940, 416, 937, 939, 331.14, 331.15, 331.16, 331.17, 331.18

[56] References Cited

U.S. PATENT DOCUMENTS

| | | | |
|---|---|---|---|
| 4,746,256 | 5/1988 | Boyle et al. ............................. | 414/217 |
| 5,346,199 | 9/1994 | Martin et al. ........................... | 271/155 |
| 5,405,230 | 4/1995 | Ono et al. ............................... | 414/217 |
| 5,504,345 | 4/1996 | Bartunek et al. ....................... | 414/936 |
| 5,571,330 | 11/1996 | Kyogoku ................................ | 414/217 |
| 5,605,428 | 2/1997 | Birkner et al. ......................... | 414/331 |
| 5,674,039 | 10/1997 | Walker et al. .......................... | 414/940 |
| 5,788,458 | 8/1998 | Bonora et al. . | |
| 5,810,537 | 9/1998 | Briner et al. ........................... | 414/937 |

*Primary Examiner*—Thomas J. Brahan
*Attorney, Agent, or Firm*—Fliesler, Dubb, Meyer & Lovejoy LLP

[57] ABSTRACT

A load port opener for separating a pod top from a pod door so that a wafer-carrying cassette may be accessed and/or transferred from the pod into a semiconductor processing station, to which the load port opener is attached. The load port opener comprises a base, an inner support plate seated on the base, an outer support plate surrounding the inner support plate, and mechanisms for raising the outer support plate away from the inner support plate. Initially, a sealed SMIF pod having a wafer-carrying cassette therein is located on top of the load port opener, such that the pod door is supported on the inner support plate, and the pod top is supported on the outer support plate. Once located on the load port opener, the pod top is decoupled from the pod door by mechanisms within the inner support plate, and thereafter the outer support plate is raised upward with the top supported thereon. The cassette remains stationary on the inner support plate, and once the top has been sufficiently raised, a pick and place robot from within the processing station may transfer wafers and/or the cassette between the load port opener and the processing station.

22 Claims, 10 Drawing Sheets

LOAD PORT OPENER

BACKGROUND OF THE INVENTION

1. Field of the Invention

The present invention relates to a transfer apparatus for use with standardized mechanical interface (SMIF) systems for facilitating semiconductor wafer fabrication, and in particular to a load port opener for facilitating transfer of wafers between a sealed SMIF pod and a semiconductor fabrication process station.

2. Description of the Related Art

A SMIF system proposed by the Hewlett-Packard Company is disclosed in U.S. Pat. Nos. 4,532,970 and 4,534,389. The purpose of a SMIF system is to reduce particle fluxes onto semiconductor wafers during storage and transport of the wafers through the semiconductor fabrication process. This purpose is accomplished, in part, by mechanically ensuring that during storage and transport, the gaseous media (such as air or nitrogen) surrounding the wafers is essentially stationary relative to the wafers and by ensuring that particles from the ambient environment do not enter the immediate wafer environment.

The SMIF system provides a clean environment for articles by using a small volume of particle-free gas which is controlled with respect to motion, gas flow direction and external contaminants. Further details of one proposed system are described in the paper entitled "SMIF: A TECHNOLOGY FOR WAFER CASSETTE TRANSFER IN VLSI MANUFACTURING," by Mihir Parikh and Ulrich Kaempf, *Solid State Technology*, July 1984, pp. 111–115.

Systems of the above type are concerned with particle sizes which range from below 0.02 microns ($\mu$m) to above 200 $\mu$m. Particles with these sizes can be very damaging in semiconductor processing because of the small geometries employed in fabricating semiconductor devices. Typical advanced semiconductor processes today employ geometries which are one-half $\mu$m and under. Unwanted contamination particles which have geometries measuring greater than 0.1 $\mu$m substantially interfere with 1 $\mu$m geometry semiconductor devices. The trend, of course, is to have smaller and smaller semiconductor processing geometries which today in research and development labs approach 0.2 $\mu$m and below. In the future, geometries will become smaller and smaller and hence smaller and smaller contamination particles become of interest.

A SMIF system has three main components: (1) minimum volume, sealed pods used for storing and transporting wafer cassettes; (2) a minienvironment surrounding cassette ports and wafer processing areas of processing stations so that the environments inside the pods and minienvironment (upon being filled with clean air) become miniature clean spaces; and (3) a transfer mechanism to load/unload wafer cassettes and/or wafers from the sealed pods to the processing equipment without contamination of the wafers in the wafer cassette from external environments.

A sealed SMIF pod generally comprises a top mating with a door located on a bottom or other surface of the pod. The wafers generally are seated within a wafer cassette that rests inside the pod on top of the pod door. In order to transfer a wafer cassette from within the SMIF pod to within a particular processing station, a pod is typically first placed on a load port of the processing station. Once located on the load port, mechanisms within the port release and separate the pod door from the pod top, and the cassette and/or individual semiconductor wafers may thereafter be transferred into the processing station.

Wafer cassettes and/or individual wafers may be accessed and transferred into a processing station by a wide variety of transfer mechanisms. One example of a cassette transfer mechanism is a cylindrical body and arm robot, also referred to as a pick and place robot, which comprises a central shaft mounted for rotation and translation with respect to a z-axis concentric with the shaft axis of rotation. The robot further includes a first arm affixed to an upper end of the shaft for rotation with the shaft, and a second arm pivotally attached to the opposite end of the first arm. The cylindrical body and arm robot further includes a precision gripping mechanism mounted at the free end of the second arm for gripping and transferring the wafer cassette. Alternatively, the gripping mechanism may comprise an end effector for gripping individual wafers. The robot is controlled by a computer such that the gripping mechanism may be controllably moved about in three-dimensional space to access and transfer a cassette and/or wafer.

Conventional load port systems include an inner support surface, such as a port door covering the load port opening, and an outer support surface such as a port plate surrounding the port door. The pod is designed so that the pod door overlies the port door, and the pod top overlies the port plate. Conventional load ports further include an elevator for supporting and lowering the port door. Once the pod door is decoupled from the pod top, the elevator lowers the port door with the pod door and cassette supported thereon. The wafers and/or cassette may thereafter be transferred to the processing station by the pick and place robot.

Conventional load ports include sensor systems for determining the position of wafers within a cassette as the cassette is lowered through the port. This positional information may be used to detect and correct any improperly positioned wafers, and may also be used for wafer mapping. In wafer mapping, the precise elevational position of one or more wafers within a cassette may be stored in a computer controlling the operation of the load port, so that the pick and place robot accessing the wafers may be accurately positioned under the wafers. In order for the sensor system to accurately detect wafer positional information for each of the wafers in the cassette, it is important that the cassette be supported on the elevator with the wafers in a substantially horizontal plane, and that the wafers remain in horizontal planes as the elevator lowers the cassette.

As a cassette is lowered away from a pod on an elevator in conventional load port systems, it is possible that fluid circulation around the wafers will result in airborne particulate lodging on the wafers. Additionally, it is possible that a wafer may move with respect to the cassette during the lowering of the cassette, thereby potentially creating particulates as a result of the frictional movement of the wafer against the cassette, or potentially unseating the wafer from within the cassette. Moreover, for ergonomic reasons, Semiconductor Equipment and Materials International("SEMI") has set a standard of approximately 900 mm for the height of the upper surface of a load port above the ground. At this height, it is often difficult or impossible to lower the elevator with a cassette thereon a sufficient distance away from the pod, after separation of the cassette from the pod. As such, it is often necessary to provide the load port at a height above that specified in the relevant SEMI standard. Further still, conventional load ports generally have relatively large footprints relative to the size of the cassette transferred thereby. It is desirable to minimize the size of the load port, as space within a clean room environment is critical. Moreover, a load port having a large footprint lessens the available space on the processing station for access to the interior of the processing station for maintenance or repairs.

SUMMARY OF THE INVENTION

It is therefore an advantage of the present invention to provide a system for transferring a cassette and/or wafers between an initially sealed SMIF pod and a wafer processing station.

It is another advantage of the present invention to provide a load port opener for transferring a cassette and/or wafers between an initially sealed SMIF pod and a wafer processing station, wherein the wafers remain stationary from the time they are loaded onto the load port opener to when they are moved into a wafer processing station.

It is a further advantage of the present invention to provide the load port opener with a small overall footprint.

It is a further still advantage of the present invention that the load port opener may be mounted on the processing station with an upper surface at a low elevation as compared with conventional load ports, such as for example at 900 mm above the ground as specified in the relevant SEMI standard.

It is another advantage of the present invention to provide a load port opener including an optical detection system for detecting wafer position within a cassette, and wafer mapping information to facilitate wafer transfer between a cassette and a wafer processing station.

These and other advantages are accomplished by embodiments of the present invention, which in general relate to a load port opener for separating a pod door from a pod top so that a wafer-carrying cassette may be transferred from the pod into a semiconductor processing station. The load port opener is preferably attached to the processing station, and comprises a base, an inner support plate seated in the base, an outer support plate surrounding the inner support plate, and mechanisms for raising the outer support plate away from the inner support plate. Initially, a sealed SMIF pod having a wafer-carrying cassette therein is located on top of the load port opener, such that the pod door is supported on the inner support plate, and the pod top is supported on the outer support plate. Once located on the load port opener, the pod top is decoupled from the pod door by mechanisms within the inner support plate, and thereafter the outer support plate is raised upward with the top supported thereon. The cassette remains stationary on the inner support plate, and once the top has been sufficiently raised, a pick and place robot from within the processing station may transfer wafers and/or the cassette between the load port opener and the processing station.

In preferred embodiments of the invention, the mechanisms for raising the outer support plate comprise first and second pairs of scissor arms provided on opposite sides of the load port opener. Both pairs of scissor arms include an arm having an end mounted on a lead screw, which lead screw is rotated by a drive mechanism at the rear of the load port opener. Upon rotation of the lead screw by the drive mechanism, the scissor arms affect the up and down motion of the port plate.

An optical detector system is mounted within the outer support plate for detecting the position of each of the wafers and/or slots within a cassette as the outer support plate moves upward or downward. The positional information regarding the wafers and the cassette slots may further be stored in memory to allow wafer and slot mapping, thus facilitating extraction and return of the wafers to and from the cassette. Control circuitry is provided in the base underneath the inner support plate for controlling operation of the drive mechanism and for receiving signals from the optical detector system.

BRIEF DESCRIPTION OF THE DRAWINGS

The invention will now be described with reference to the accompanying drawings in which:

FIG. 3 is a rear perspective view of a load port opener according to the present invention showing the drive mechanism and drive system;

DETAILED DESCRIPTION

The invention will now be described with reference to FIGS. 1–6 which in general relate to a load port opener for separating a SMIF pod door from a SMIF pod top to present a wafer-carrying cassette within the SMIF pod to a wafer processing station. In a preferred embodiment, the present invention is configured to operate with 200 mm SMIF pods. However, it is understood that the present invention may operate with pods of various sizes, and with pods other than SMIF pods. Moreover, it is understood that the present invention may be used to transfer wafers and/or a wafer-carrying cassette to within any processing station utilized in the fabrication and testing of semiconductor wafers in a cleanroom environment. The terms "wafer" and "semiconductor wafer" as used herein refer to a wafer substrate as it may exist in any of the various stages of the semiconductor wafer fabrication process. Furthermore, it is understood that the present invention may operate with substrates other than semiconductor wafers, such as for example, flat panels, reticles or other work pieces.

Figure 1:
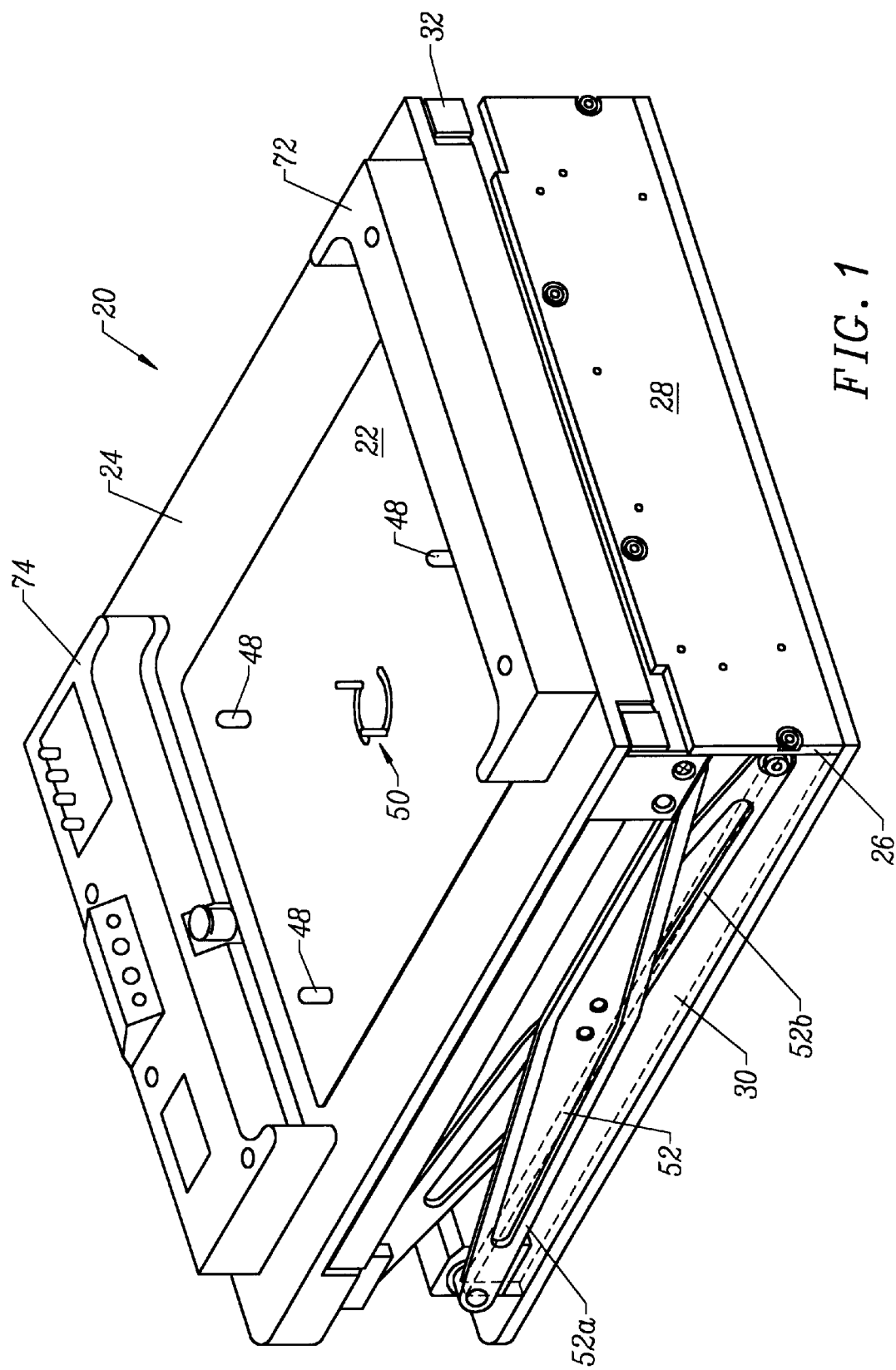
FIG. 1 shows a front perspective view of a load port opener according to the present invention in a retracted position.
Figure 3A:
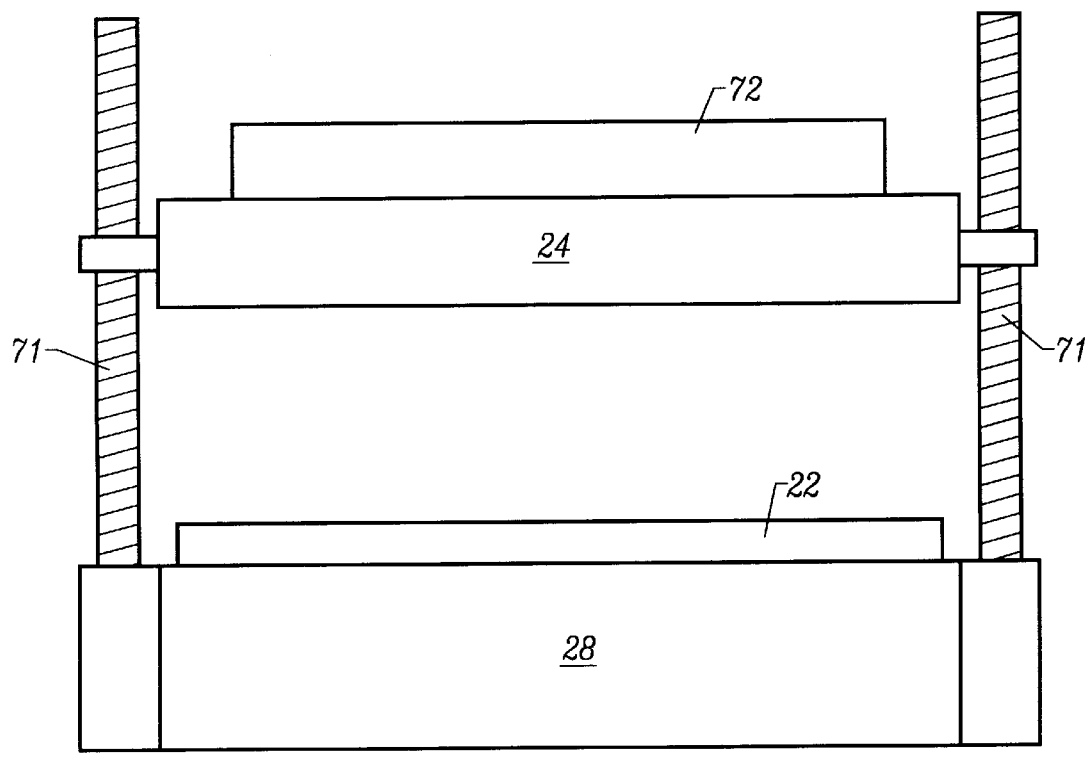
FIGS. 3A and 3B are front and perspective views, respectively, of alternative lift mechanisms for lifting the outer support plate with respect to the inner support plate.
Figure 3B:
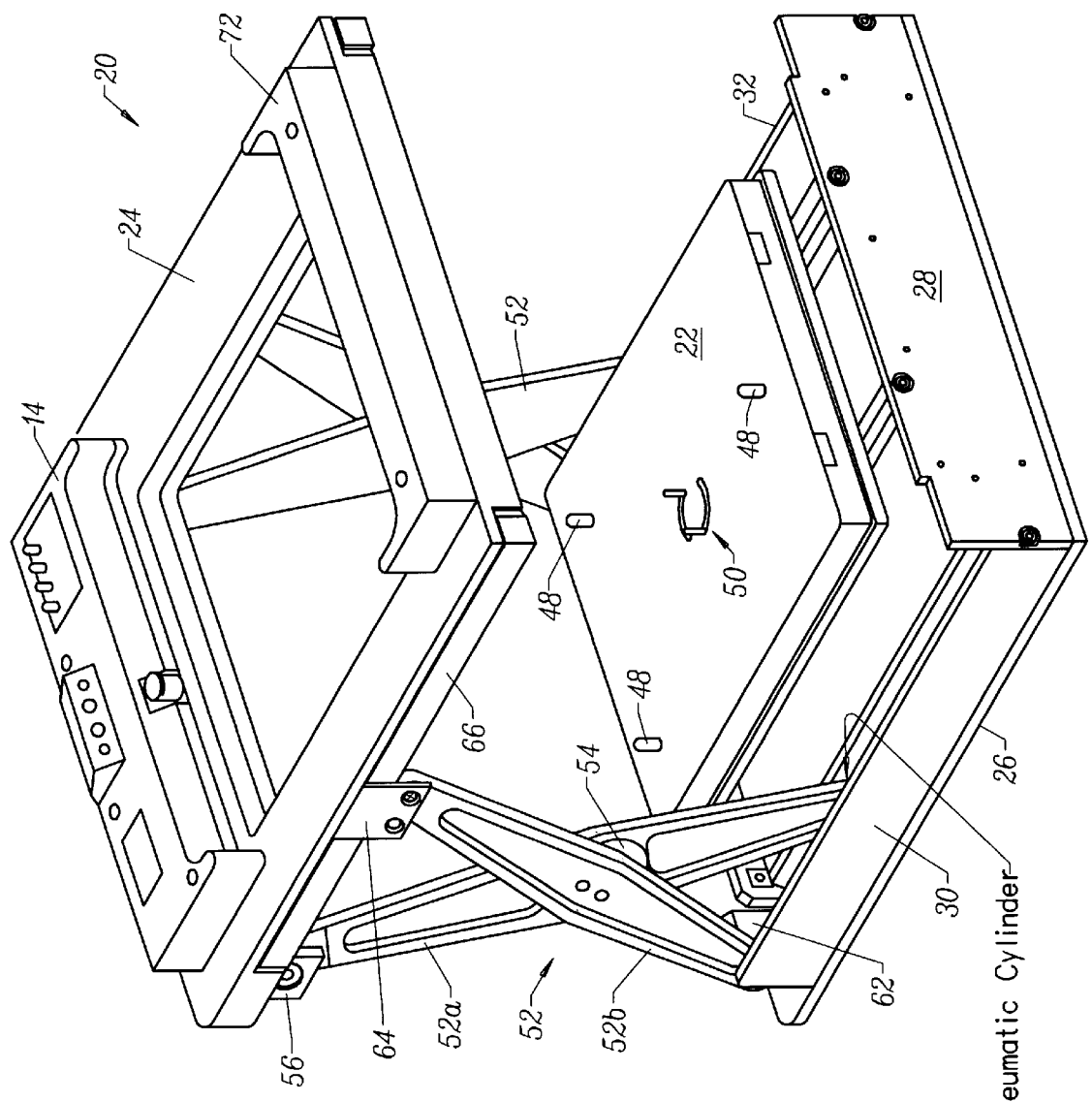
Figure 4:
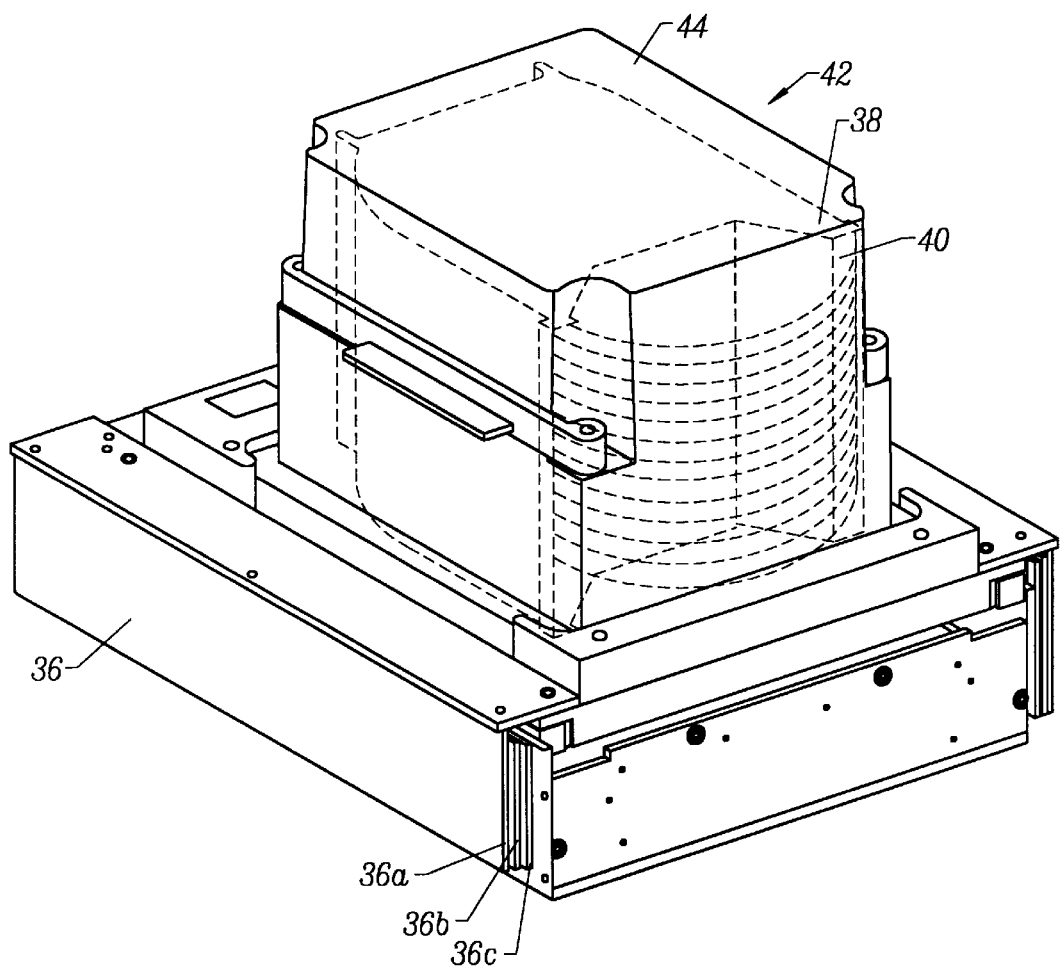
FIG. 4 is a front perspective view of a load port opener according to the present invention in a retracted position including a telescopic cover around the sides of the load port opener, and further including a SMIF pod seated thereon.

Referring now to FIGS. 1–5, there is shown a load port opener 20 including an inner support plate 22 mating with and surrounded by an outer support plate 24 when the load port opener 20 is in a retracted position (FIGS. 1 and 4). The load port opener according to embodiments of the present invention further includes a base 26 having a front 28, sides 30 and 32, and a rear 34. The load port opener 20 is preferably supported adjacent a processing station (not shown), such that the front 28 of the load port opener 20 is adjacent to a port (not shown) located on a front, side, or other vertical surface of the processing station. The remaining sides 30, 32 and rear 34 are preferably substantially sealed by telescopic cover 36 (shown in FIGS. 4 and 5, and omitted from FIGS. 1–3 for clarity) as explained hereinafter to define a minienvironment within the load port opener 20.

As partially shown in FIG. 3, the outer support plate 24 preferably includes a panel 35 mounted thereon and extending above the plate 24 at the front 28 of the load port opener. When the load port opener 20 is in a retracted position, the panel 35 covers the port on the processing station to prevent particulates, ambient light, etc., from entering into the process station. As the outer support plate 24 moves upwards as explained hereinafter, the panel 35 moves upward with the plate 24 to thereby uncover the processing station port.

In a preferred embodiment, a pod 42 carrying a cassette 38 having one or more wafers 40 is positioned on top of load port opener 20 in preparation for transfer of the cassette and/or wafers into the processing station. As used herein, the term "cassette" refers to any structure for holding one or more substrates, which structure includes an open end through which the substrates may be inserted and extracted. The pod 42 may be transferred onto the load port opener either manually or by automated mechanisms. The pod 42 is preferably a SMIF pod including a pod top 44 mating with a pod door 46, on which pod door the cassette 38 is supported. It is understood that the pod may be other than a SMIF pod in alternative embodiments of the invention. The inner support plate 22 and outer support plate 24 are preferably of a standard size as defined in the relevant SEMI standard.

Properly positioned, the pod 42 is located on load port opener 20 with the pod door 46 supported on the inner support plate 22, and the pod top 44 supported on the outer support plate 24. In a preferred embodiment, inner and outer support plates 22 and 24 may be formed of a temperature stable, rigid material having low outgassing properties, such as for example aluminum. It is understood that the support plates may be formed of other materials, such as for example other metals or high strength plastics.

The inner support plate 22 and the pod door 46 may include a plurality of protrusions on their upper surface, which protrusions are received within holes (not shown) on the bottom of the pod door and cassette, respectively. The protrusions and holes together ensure that the pod 42 and the cassette 38 are positioned in the same, predetermined rotational orientation on the inner support plate 22. Such protrusions are indicated on the inner support plate at reference numerals 48. It is understood that other schemes may be used to properly align the cassette within the pod, and the pod on top of the load port opener. For example, 200 mm wafer cassettes conventionally include an H-bar construction on the bottom of the cassette for aligning the cassette within the pod. Moreover, it is known to employ kinematic mounts for positioning a cassette with respect to a pod, and a pod with respect to a support surface.

Once positioned on the load port opener, the pod door is separated from the pod top by means of a latch mechanism 50 provided within the inner support plate. Although not critical to the present invention, details related to such a latch mechanism are described in U.S. Pat. No. 4,995,430 entitled "Sealable Transportable Container Having Improved Latch Mechanism", which Patent is assigned to the owner of the present application and is incorporated by reference in its entirety herein. It is also contemplated that the latch mechanism be provided within the outer support plate. Once the pod door and top are decoupled from each other, the outer support plate 24 may raise the pod top 44 away from the pod door 46 and cassette 38 along a vertical axis as described hereinafter. The outer support plate 24 may include retaining clips (not shown) for securing the pod top 44 on the plate 24.

Figure 2:
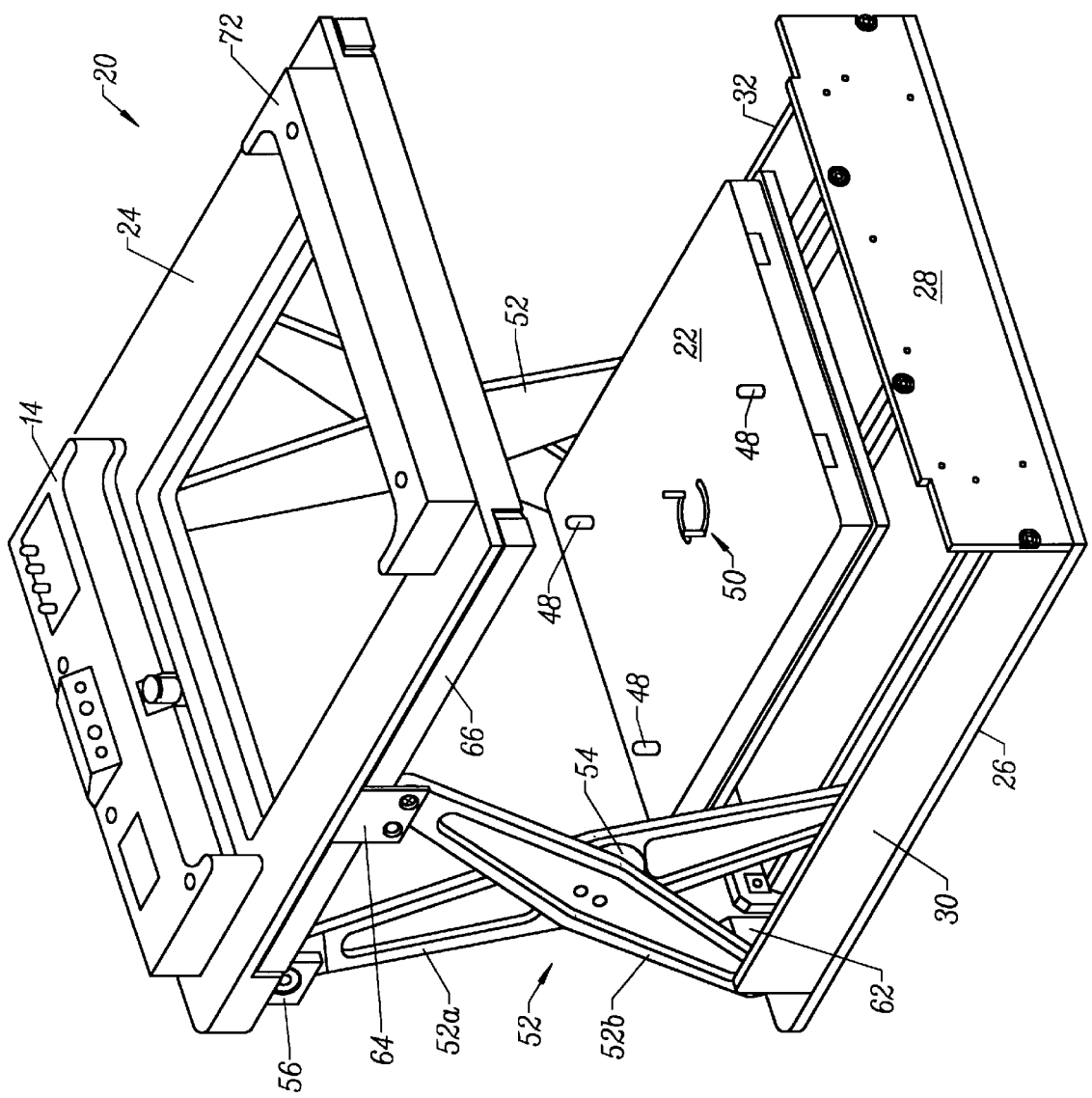
FIG. 2 shows a front perspective view of a load port opener according to the present invention in an extended position.

The load port opener 20 preferably further includes first and second pairs of scissor arms 52. The first and second scissor arms are structurally and operationally identical to each other, and as such, only one pair of scissor arms 52 shall be described hereinafter. It is understood that the following description of the first pair of scissor arms is equally applicable to the second pair of scissor arms. The first pair of scissor arms 52 is comprised of arms 52a and 52b pivotally joined together by a bearing 54 at an approximate midsection of the arms 52a and 52b. The arms may be formed of aluminum, or other similar rigid material with low particulate generation. As best seen in FIGS. 1–3, arm 52a has a first end pivotally mounted to a bracket 56 stationarily mounted on the outer support plate 24. Arm 52a has a second end opposite the first end pivotally mounted to a carriage 58 riding on a lead screw 60. Similarly, arm 52b has a first end pivotally mounted to a bracket 62 stationarily mounted on the base 26. Arm 52b has a second end opposite the first end pivotally mounted to a carriage 64 which rides along a rail 66.

The lead screw 60 is affixed to an endless chain 68 attached to a drive mechanism 70 mounted at rear 34 of base 26. In particular, drive mechanism includes a motor, such as a servo or stepper motor, for driving a sprocket to which chain 68 is attached. As would be appreciated by those skilled in the art, drive mechanism 70 is capable of driving chain 68, which in turn rotates lead screw 60. Drive mechanism 70 is controlled by control circuitry (not shown) provided within the base 26, underneath the inner support plate 22. The control circuitry may communicate with a computer (not shown) associated with the processing station. The on-board electronics allows the load port opener to be a self-contained unit. The chain 68 may be replaced by another similar power transmission mechanism, such as for example a cable, timing belt, or gear train.

Once the pod top has been decoupled from the pod door as previously described, the control circuitry activates drive mechanism 70 to thereby rotate lead screw 60. Lead screw 60 is rotated in a direction so that carriage 58 moves along lead screw 60 from a position near the front 28 of the load port opener toward the rear 34 of the load port opener. As second arm 52b is pivotally attached to first arm 52a at the bearing 54, rearward motion of the carriage 58 along lead screw 60 will cause a corresponding rearward motion of carriage 64 along rail 66. In this manner, the outer support plate with the pod top supported thereon is raised from a retracted position shown in FIG. 1 to an extended position shown in FIG. 2. It is contemplated that the positions of lead screw 60 and rail 66, as well as the structures mating therewith, be reversed in alternative embodiments of the present invention.

Although the cassette is initially sealed within a pod 42 when loaded onto the load port opener in a preferred embodiment, it is contemplated that the cassette may be loaded directly onto the inner support plate 22, without the pod. Thereafter, a top similar or identical to top 44 may be placed over the cassette, supported on the outer support plate 24, and then the outer support plate may be raised as described above. In a preferred embodiment, the outer support plate 24 raises up to a height sufficient to allow transfer of the cassette 38 from the load port opener into the processing station. However, it is contemplated that the load port opener may be configured to raise the outer support plate only a fraction of the height of the cassette 38 in alternative embodiments of the invention.

As noted, the second pair of scissor arms is structurally and operationally identical to the first pair of scissor arms, and is mounted on a second lead screw which is also driven by drive mechanism 70 so that the movement of the first and second pair of scissor arms during raising and lowering of the outer support plate are identical to each other. Utilization of the first and second pairs of scissor arms has advantages in that they may reside and operate entirely within the footprint of the base 26 of the load port opener, and are capable of precisely maintaining the outer support plate in horizontal planes as the outer support plate is raised. However, as would be appreciated by those skilled in the art, other lift mechanisms may be used to raise the outer support plate away from the inner support plate. For example, a cantilevered lift mechanism may be provided with the outer support plate being raised and lowered along at least one vertically oriented lead screw 71, as shown in FIG. 3A. Alternatively, a pneumatic or hydraulic drive system 73 (shown schematically in FIG. 3B) may be used in place of the horizontally oriented lead screws 60 shown in FIG. 3, or the at least one vertically oriented lead screw 71 shown in FIG. 3A.

In a preferred embodiment of the invention, the load port opener 20 further includes telescopic cover 36 (FIGS. 4-5) around the sides and rear of the load port opener. The cover 36 is preferably comprised of leaves 36a-c formed of, for example, aluminum. Alternatively or additionally, one or more sides of the telescopic cover 36 may be formed of a transparent polycarbonate, or other transparent, high strength, low outgassing plastic. The transparent plastic allows an operator to better view the cassette 38 within the load port opener. The transparent plastic may also be UV colored to prevent ambient light from entering into the process station port when the port is open.

Figure 5:
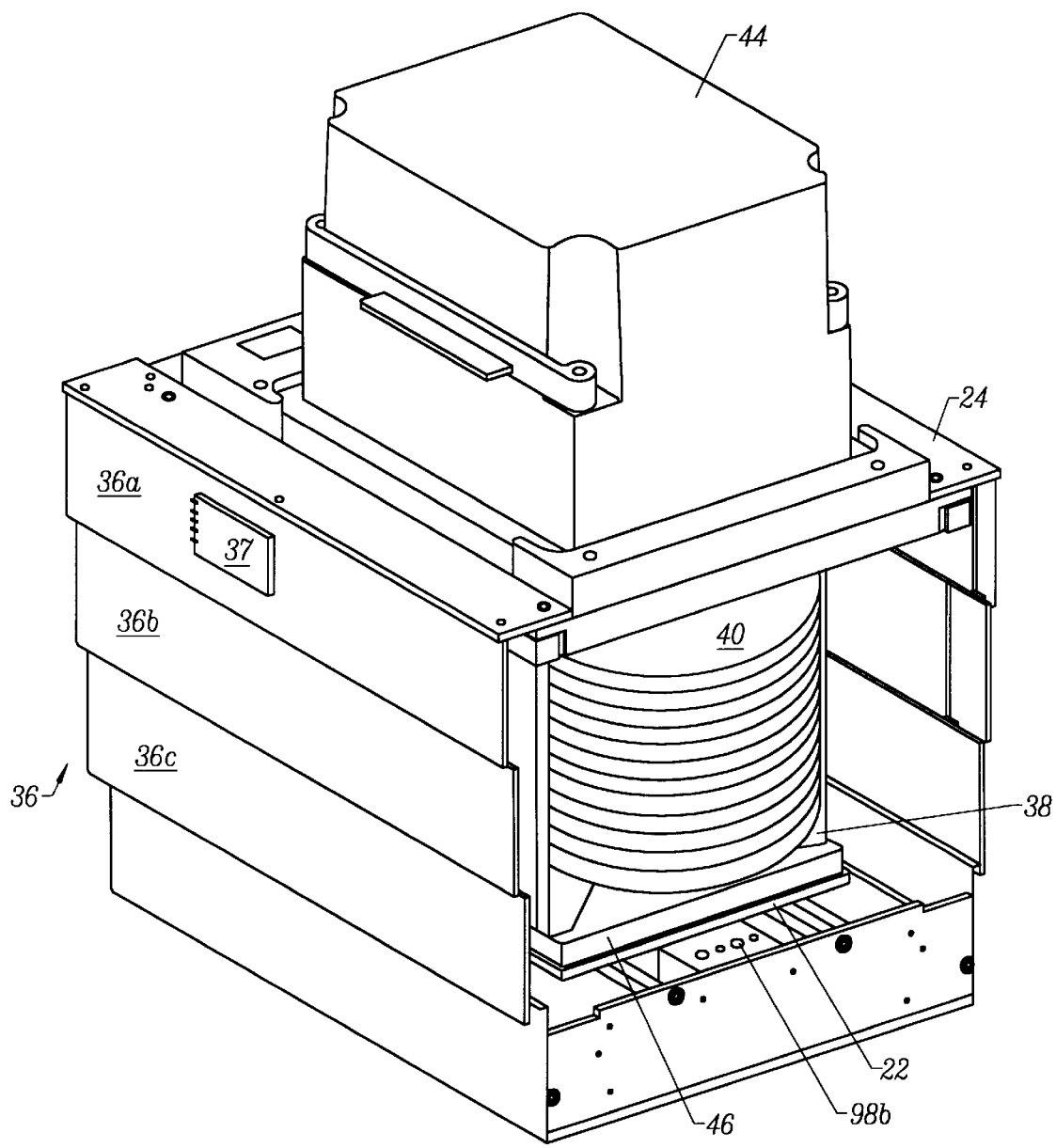
FIG. 5 is a front perspective view of a load port opener according to the present invention in an extended position with a telescopic cover around sides of the load port opener defining a minienvironment within the load port opener, and a SMIF pod where the top has been separated from the door.

When the load port opener 20 is in a retracted position as shown in FIG. 4, the leaves 36a-c are vertically coextensive with each other and the sides and rear of the load port opener. As the first and second pairs of scissor arms initially extend the outer support plate 24 upward, the first leaf 36a moves upward with the plate 24. As the plate 24 continues its upward movement, guide rods 37 mounted in leaves 36a-b lift first leaf 36b and then 36c upward so that the cover 36 extends telescopically. Thus, as the load port opener extends, and when the load port opener is completely extended as shown in FIG. 5, the telescopic cover defines a minienvironment within the load port opener to prevent contaminants from the surrounding environment from contacting the wafers 40. It is a feature of the present invention that the minienvironment is self-contained within the load port opener 20 as a result of the cover 36 being part of the load port opener.

The pressure within the processing station is generally slightly higher than that of the surrounding environment, so that upon opening of the process station port to which the front 28 of the load port opener is attached, clean air will flow from the process station into the load port opener and out of the load port opener through spaces provided between the leaves 36a-c of the telescopic cover 36. This further prevents contaminants from the environment surrounding the load port opener 20 from entering into the load port opener 20. One of the leaves 36a-c may include a flap 37 pivotally mounted by a hinge on an outer surface of the leaf. If the pressure within the minienvironment became too great for the fluid to adequately escape through the spaces between the leaves, the flap 37 would be pushed open to relieve pressure within the minienvironment. The flap would not allow entry of fluid from outside of the minienvironment into the minienvironment. It is further contemplated that a self-contained fan and filtration system be provided in the base for circulating fluid and filtering out particles and contaminants. The fan and filtration system may circulate clean air, nitrogen, or other fluids for removing contaminants and for deionizing the interior of the load port opener.

Figure 5A:
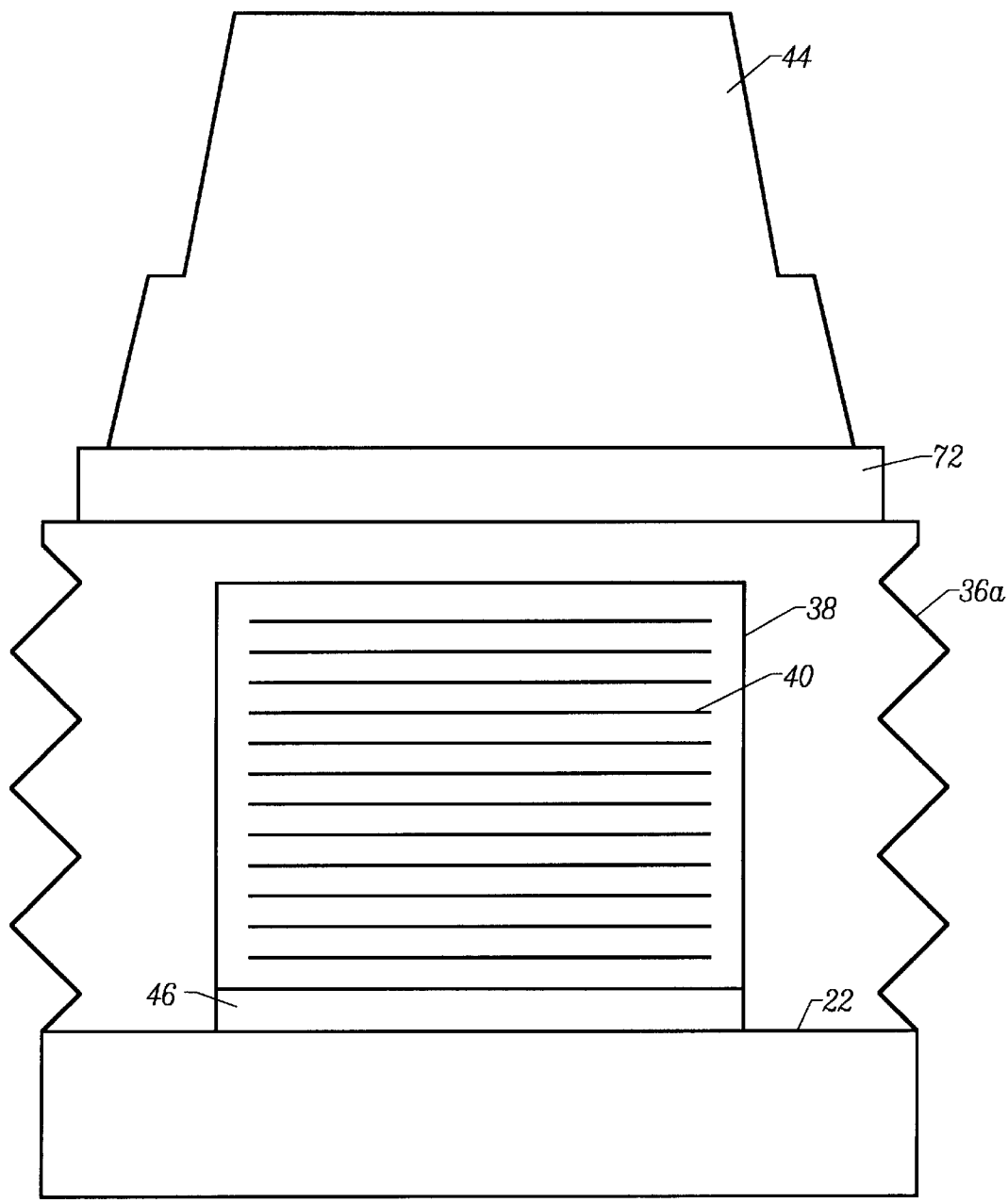
FIG. 5A is a front view of a load port opener including a cover according to an alternative embodiment of the invention.

It is understood that other covers may be used to create a minienvironment within the load port opener 20. For example, instead of a telescopic cover, the cover may alternatively be an accordion-type cover 36a (FIG. 5A) capable of extending with the outer support plate as the outer support plate rises. Additionally, the cover may comprise vertically oriented planar shields around the sides and rear of the load port opener, which shields have bottom portions fixedly and stationarily mounted on the base 26 and extending upwards. Thus, when the load port is in a retracted position, the shields extend up above the outer support plate. The shields extend high enough above the base so as to extend at least as high as the outer support plate when the outer support plate has risen to its highest elevation. As such, when the outer support plate is raising upward or at its highest elevation, the shields define a minienvironment within the load port. As would be further appreciated by those skilled in the art, one or more sides of the shields may alternatively have top portions fixedly and stationarily mounted to the outer support plate so as to rise upward with the outer support plate.

Figure 6:
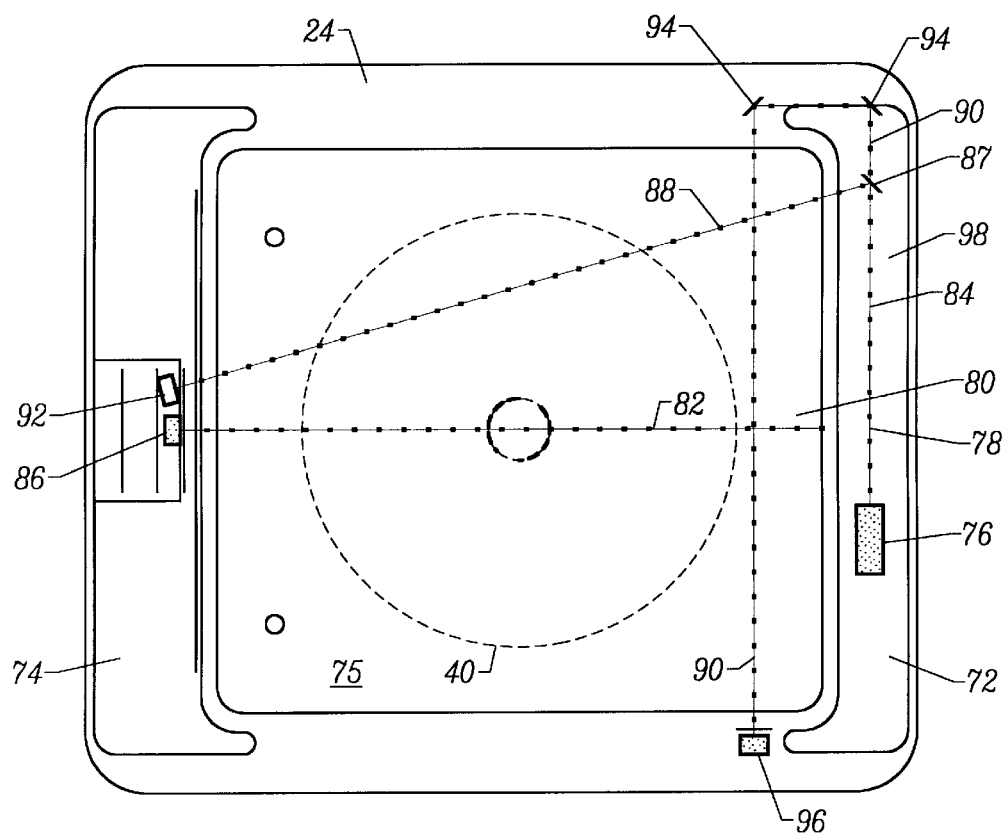
FIG. 6 is a top view of the outer support plate of the load port opener, showing the optical detector system therein.

An optical detector system according to the present invention will now be described with reference to FIG. 6. The outer support plate 24 includes a first mount 72, and a second mount 74 across a central aperture 75 in the outer support plate from first mount 72. The first and second mounts together house the components of the optical detector system as described hereinafter. A laser diode emitter 76 is preferably mounted within first mount 72 for emitting a beam 78. Although not critical to the present invention, the laser diode emitter 76 is integrated with a regulated power supply circuit and a focusable collimating lens, and emits a visible beam at 670 nanometers wavelength. The beam 78 is directed toward a beam splitter 80 oriented at 45° with respect to the beam 78 such that a first portion 82 of beam 78 is reflected across the central aperture 75, and a second portion 84 of beam 78 is transmitted through the beam splitter 80. The beam portion 82 is received within a wafer present sensor 86 provided within the second mount 74 on outer support plate 24. As the outer support plate 24 moves upward as previously described, the wafer present sensor 86 is able to detect the elevational position of each wafer 40 within cassette 38. The beam portion 82 and sensor 86 may also be used to detect cross-slotted wafers, and the absence of a wafer from a particular slot.

The information from cassette present sensor 86 may preferably be transferred to the control circuitry and stored into memory for wafer mapping. The stored information is available for use by the computer to accurately position the pick and place robot for wafer retrieval without damage to the wafers. A flexible, shielded ribbon cable may be provided between the mounts 72 and/or 74 and the control circuitry for transferring the positional information and other signals.

The beam portion 84 passing through beam splitter 80 is further divided upon contact with a beam splitter 87. Beam splitter 87 is provided at an angle so as to reflect a portion 88 of the beam at an angle across the aperture in the outer support plate, and to transmit a portion 90 therethrough. The beam portion 88 is received in a cassette slot sensor 92 provided in the second mount 74, which sensor 92 is aligned to receive the beam portion 88. The beam portion 88 is directed across the aperture 75 in the outer support plate 24 so as to pass through a portion of the wafer support slots (not shown) in the cassettes, which slots are provided to support the wafers within a cassette. As the outer support plate 24 moves upward as described above, the beam portion 88 and cassette slot sensor 92 are able to detect the precise elevational position of a particular cassette slot. The information from the cassette slot sensor 92 may be transferred to the control circuitry and stored in memory for slot mapping, so that a pick and place robot may be positioned to return a wafer to the cassette 38 at a known elevation of a particular cassette slot.

The wafers 40 within the cassette 38 are conventionally held in their proper position within the cassette while the cassette is sealed within the pod. As the cassette does not move during separation of the cassette from the pod according to the present invention, it is unlikely that any of the wafers will improperly protrude from the cassette as the outer support plate moves upward. However, if for example, the load port opener is subject to a shock as the outer support plate moves upward, one of the wafers may improperly protrude from the cassette. Moreover, where wafers are transferred by the pick and place robot from the processing station to the cassette, with the outer support plate in an extended position, the robot may not fully seat the wafers within their respective slots and one or more wafers may protrude from the cassette.

Therefore, the beam portion 90 transmitted through the beam splitter 87 is reflected off mirrors 94 which together reflect the beam portion 90 back 180° across a front section of the aperture 75, whereupon the beam portion 90 is received within a wafer protrusion sensor 96. As the outer support plate 24 moves upward and downward, the beam portion 90 and wafer protrusion sensor 96 together detect any wafers which may be protruding beyond the front of the cassette. Upon activation of the sensor 96 by a protruding wafer 40, the computer causes a wafer seater mechanism (not shown) to move the out-of-position wafer into its proper location within the cassette 38. The beam portion 90 and wafer protrusion sensor 96 may additionally be used to detect the presence of a cassette on top of the inner support plate 22, which information may be forwarded to the control circuitry as described above.

The optical detector system may further include an excessive wafer protrusion sensor 98 comprised of emitter 98a mounted in the outer support plate and receiver 98b (FIG. 5) mounted in the base. As the outer support plate 24 moves downward, the excessive wafer protrusion sensor 98 will sense any wafers that protrude too far out of cassette 38 to be reseated by the wafer seater mechanism. In the event excessive wafer protrusion sensor 98 is activated, further operation of the load port opener is preferably halted so that the wafer may be manually reseated into the cassette slot. In a preferred embodiment sensor 98 may comprise a block-the-beam sensor. Alternatively, sensor 98 may comprise a reflective sensor mounted entirely in the outer support plate or base. The reflective sensor operates by emitting a beam which will be reflected back into the sensor by an excessively protruding wafer, thus activating the sensor.

While a preferred embodiment of the optical detector system has been described above, it is understood that other sensing mechanisms may be provided for detecting the position of a wafer and for allowing wafer mapping. For example, IR or block-the-beam emitters and receivers may replace some or all portions of the beam emitted from diode 76 and the above-described sensors. Additionally, video cameras such as a charge coupled display (CCD) camera may be used. It is important that each of the portions of the beam emitted from the laser diode 76 travel in substantially horizontal planes. It is therefore a feature of the scissor arms 52 and the drive mechanism 70 that they are capable of raising the outer support plate 24 through successive horizontal planes, substantially parallel to the planar surface of the wafers.

In embodiments of the invention described to this point, the inner support plate 22 and cassette 38 remain stationary while the outer support plate 24 is raised upward. In an alternative embodiment of the invention, it is contemplated that the inner support plate 22 be capable of rotation. Details relating to a system wherein an inner support plate is capable of rotation are disclosed in co-pending U.S. application Ser. No. 08/680,242, entitled, "Cassette Support and Rotation Assembly For SMIF Applications," filed Jul. 10, 1996, which application is assigned to the owner of the present application, and which application is incorporated by reference herein in its entirety. In general, the inner support plate may be mounted on bearings which are in turn mounted to the base. Additionally, a rotation drive mechanism is provided on the base or lower surface of the inner support plate for controllably rotating the inner support plate so as to align the cassette on the top surface of the inner support plate to a desired rotational orientation. The inner support plate may also be controlled to pivot eccentrically, for example by mounting the inner support plate on an eccentric shaft capable of rotation. Additionally or alternatively, the inner support plate may be controlled to translate into and out of the load port opener through the front 28, for example by mounting the inner support plate on a carriage, which is in turn mounted on a lead screw rotated by a drive motor. Rotation, pivoting and/or translation of the inner support plate adds flexibility with regard to where the load port opener may be mounted on the processing station, how the pod 42 may be initially loaded onto the load port opener, and how the cassette 38 and/or wafers 40 may be transferred into and out of the load port opener.

Figure 7:
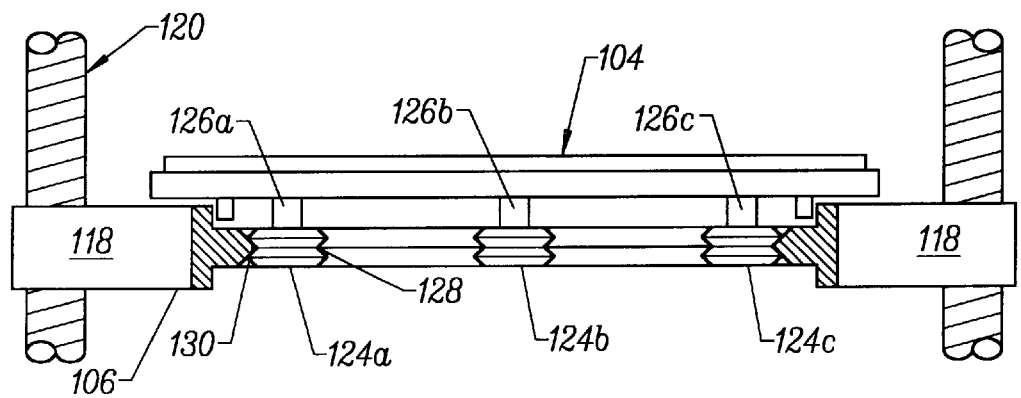
FIG. 7 is a partially sectioned front view of a rotation plate rotatably supported on the inner support plate.
Figure 8:
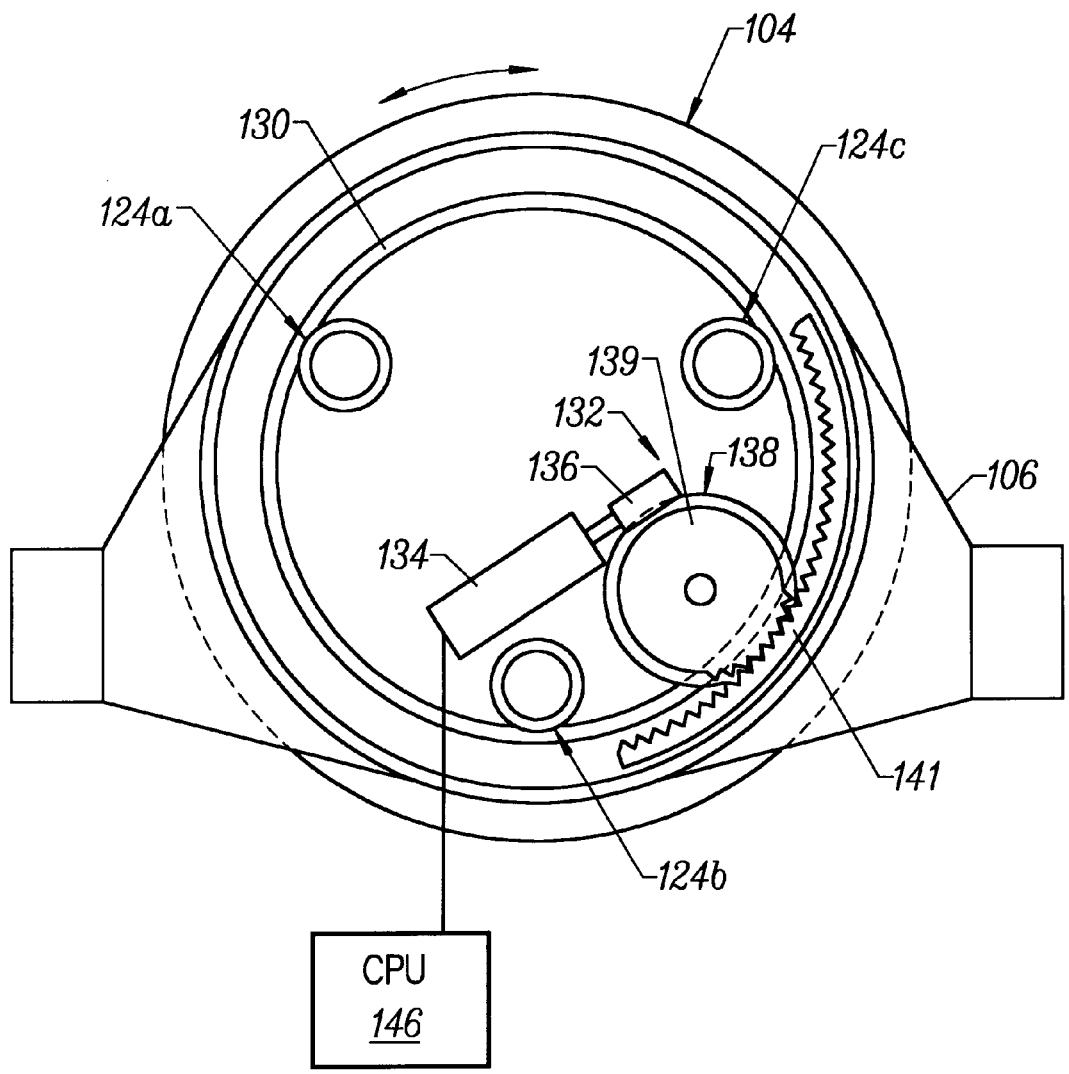
FIG. 8 is a bottom view of a rotation plate include a rotation drive mechanism according to the present invention.

In particular, according to embodiments of the present invention shown in FIGS. 7–8, the inner support plate 22 may include a rotation assembly comprising a rotation plate 104, support bearings 124a, 124b, and 124c, and rotation drive mechanism 132. The rotation plate 104 is rotatably supported on inner support plate 22 by means of support bearings 124a, 124b, and 124c. The support bearings 124a–c are rotatably mounted on shafts 126a–c, respectively, which shafts are mounted in the underside of rotation plate 104. Each support bearing 124a–c includes a V-shaped groove 128 which mates with an angled extension 130 around the inner circumference of the inner support plate 22. One of the support bearings 124a–c may be adjustable so as to initially allow the support bearings 124a–c to be fitted onto the angled extension 130, and also to ensure a tight tolerance between the support bearings 124a–c and the angled extension 130. The support bearings 124a–c and the angled extension 130 cooperate to rotatably support rotation plate 104 with respect to inner support plate 22 to allow planar and concentric rotation of the rotation plate, while preventing movement of the rotation plate in the x, y, or z directions with respect to inner support plate 22. While the above-described system for rotatably supporting the rotation plate 104 with respect to the inner support plate 22 is advantageous for its high degree of dimensional control, as would be appreciated by those skilled in the art, other known systems may be used to rotatably support rotation plate 104 on inner support plate 22.

FIG. 8 is a bottom view of the rotation plate 104 showing a preferred embodiment of the rotation drive mechanism 132 for rotating the rotation plate through a precise and predetermined angle with respect to its position when the wafer-carrying cassette 38 is initially loaded thereon. In a preferred embodiment, rotation drive mechanism 132 includes a rotation motor 134 mounted to a bottom surface of rotation plate 104 for rotating a drive gear 136 affixed to an end of the motor 134. Rotation motor 134 may be a conventional motor, such as a stepper or a servo motor with position and/or velocity feedback. The drive gear 136, in turn, meshes with and drives a worm gear 138 rotatably mounted on a bottom surface of rotation plate 104. In this embodiment, a spur gear 139 is affixed on and concentric with the worm gear 138. The spur gear 139 in turn meshes with a circular rack gear 141 fixedly mounted around the periphery of the inner support plate 22. Although only a small segment of the rack gear 141 is shown on FIG. 8, the rack gear 141 extends 360° around the periphery of the inner support plate in a preferred embodiment. In the embodiment shown in FIG. 8, the rotation drive mechanism 132 is capable of rotating rotation plate 104 through a full 360°, and the direction of rotation of rotation plate 104 may be reversed by reversing the current flow to rotation motor 134. In this embodiment, the CPU 146 may control the rotation drive mechanism to orient the rotation plate at any desired angle with respect to the inner support plate.

Rotation motor 134 may be electrically coupled to a central processing unit (CPU) 146 shown schematically in FIG. 8. The rotation drive mechanism 132 shown in FIG. 8 provides an advantage in that it may be controlled by CPU 146 to rotate rotation plate 104 to a precise and highly repeatable predetermined angle, and is capable of maintaining rotation plate 104 at the predetermined angle despite significant external shocks that may impact on the rotation plate. A conventional encoder (not shown) may also be located on the rotation plate 104 and a sensor provided on the inner support plate, which encoder and sensor together provide closed-loop servo signals to the CPU 146 to further ensure precise alignment of the rotation plate 104 at the predetermined angle. The present invention may additionally include a sensor system (not shown) comprising an emitter and receiver provided respectively on the rotation plate and pick and place robot, which sensor system generates a signal to cease rotation when the cassette opening and robot are properly aligned. Such a sensor system may for example comprise a conventional block-the-beam sensor. The cassette support and rotation assembly may affect rotation of the rotation plate before, during or after the rotation plate is separated from the outer support plate 24.

It is understood that other known rotating assemblies may be employed to rotate rotation plate 104 with respect to inner support plate 22. For example, in an alternative embodiment of the invention shown in FIG. 9, the rotation drive mechanism 132 may comprise a motor 134 and drive gear 136 and worm gear 138 as described above, and also a rotation link 140. The link 140 has a first end mounted by a pin 142 to an outer circumference of the worm gear and a second end mounted by a pin 144 to a bottom surface of the inner support plate 22.

As would be appreciated by those skilled in the art, worm gear 138 cooperates with rotation link 140 such that rotation of worm gear 138 will cause reciprocating rotation between rotation plate 104 and inner support plate 22. By way of example, the position of the rotation plate 104, worm gear 138 and rotation link 140 shown in FIG. 9 may represent the initial position of the rotation plate when the cassette is first located thereon. From that position, a 180° rotation of the worm gear 138 will cause the rotation plate 104 and wafer-carrying cassette 38 to rotate from their initial positions to a predetermined angle at which the cassette is aligned with the pick and place robot. After wafer transport has been completed by the pick and place robot, further rotation of the worm gear from 180° to 360° will cause the rotation plate and cassette to reverse their rotational direction and return to their initial positions. In a preferred embodiment of the invention, the worm gear 138 and rotation link 140 may be sized and the pins 142 and 144 located in such a position that a 180° rotation of worm gear 138 from the approximate position shown in FIG. 9 will rotate the rotation plate 104 approximately 35° from its initial position. However, it is understood that rotation plate 104 may be made to rotate through an angle greater or less than 35° in alternative embodiments of the invention. One skilled in the art would appreciate how to vary the size of worm gear 138 and rotation link 140 and vary the position of pins 142 and/or 144 to vary the rotation of rotation plate 104 with respect to inner support plate 22 to be less than or greater than 35°.

Figure 9:
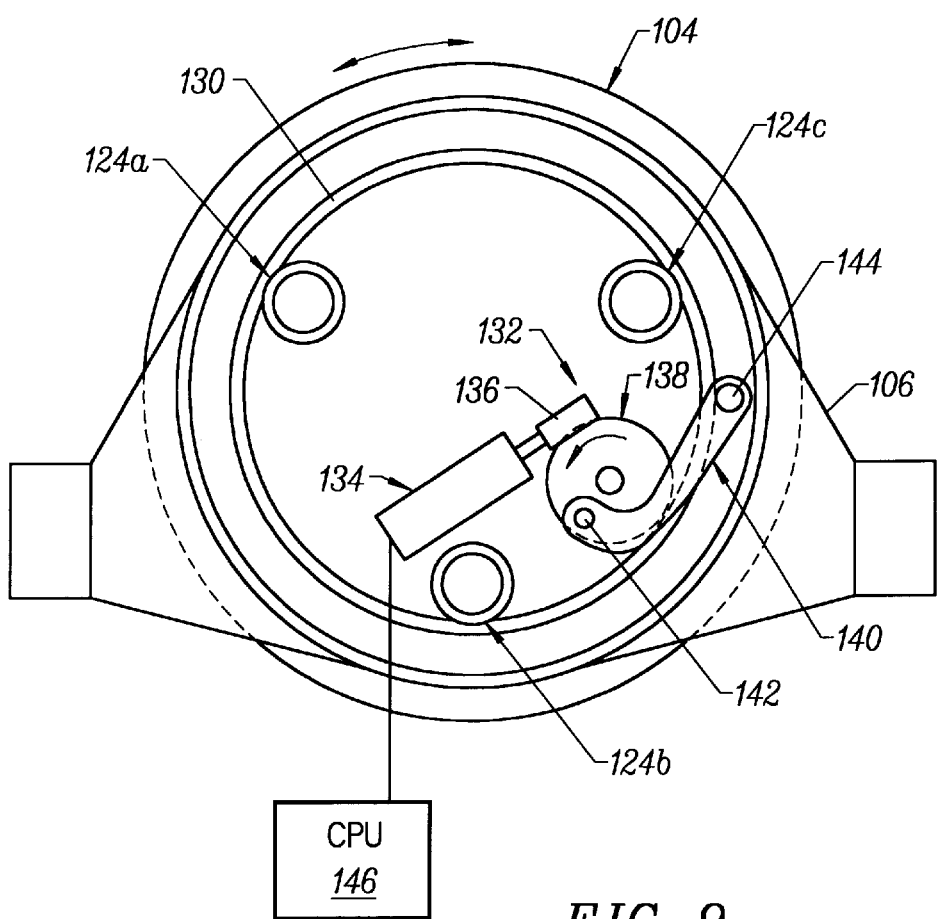
FIG. 9 is a bottom view of alternative embodiments of the rotation drive mechanism according to the present invention.

From the position shown in FIG. 9, counterclockwise rotation of the worm gear 138 will initially cause a clockwise rotation of the rotation plate 104. Those skilled in the art would appreciate that the initial direction of rotation of the rotation plate 104 may be reversed from that shown in FIG. 9 in several ways, including for example reversing the current flow to the motor, or by moving worm gear 138 and rotation link 140 to the opposite side of the rotation plate.

Although the invention has been described in detail herein, it should be understood that the invention is not limited to the embodiments herein disclosed. Various changes, substitutions, and modifications may be made thereto by those skilled in the art without departing from the spirit or scope of the invention as described and defined by the appended claims.

I claim:

1. A device for presenting a cassette from within a pod to a transfer device of a processing station, the pod including a pod top mating with a pod door and the cassette including at least one work piece, so that a transfer mechanism is able to access the cassette and/or the at least one work piece for transfer into the processing station, the device comprising:

a base, a lower surface of said base defining at all times a lowermost portion of the device;

an inner support plate, mounted in said base, for supporting the cassette, said inner support plate including a decoupling mechanism for decoupling the pod door from the pod top;

an outer support plate for supporting the pod top, said outer support plate being circumjacent about said inner support plate, and said out support plate defining at all time an uppermost portion of the device;

an elevator for moving said outer support plate and pod top vertically upwards away from said inner support plate to provide access to the at least one work piece within the cassette by the transfer mechanism;

a drive mechanism for driving said elevator;

an optical detector system mounted on an upper surface of said outer support plate and moving with said outer support plate, said optical detector system including:

a light source for emitting a light beam in a horizontal plane, said light source being split into at least a first portion and a second portion, a first sensor for receiving said first portion, said first sensor and said first portion being capable of indicating when the at least one work piece within the cassette resides in said horizontal plane, and a second sensor for receiving said second portion, said second sensor and said second portion being capable of indicating when the at least one work piece is not properly seated within the cassette; and a control mechanism for controlling said drive mechanism.

2. A device for presenting a cassette from within a pod to a transfer device of a processing station as recited in claim 1, further comprising a cover around the device and defining an opening through which the transfer device is capable of accessing the cassette and/or the at least one work piece.

3. A device for presenting a cassette from within a pod to a transfer device of a processing station as recited in claim 2, wherein said cover is a telescopic cover.

4. A device for presenting a cassette from within a pod to a transfer device of a processing station as recited in claim 2, wherein said cover is an accordion-type cover.

5. A device for presenting a cassette from within a pod to a transfer device of a processing station as recited in claim 2, further comprising a computer memory for storing an elevational position of the at least one work piece as indicated by said first sensor and said first portion.

6. A device for presenting a cassette from within a pod to a transfer device of a processing station as recited in claim 1, wherein the cassette includes at least one slot for supporting the at least one wafer within the cassette, further comprising a third sensor mounted in said outer support plate for at least sensing an elevational position of the at least one slot.

7. A device for presenting a cassette from within a pod to a transfer device of a processing station as recited in claim 6, further comprising a computer memory for storing said elevational position of the at least one slot.

8. A device for presenting a cassette from within a pod to a transfer device of a processing station as recited in claim 1, wherein said elevator comprises:

a first pair of scissor arms mounted on a first side of the device; and a first lead screw, an end of an arm of said first pair of scissor arms being mounted on said first lead screw such that said end of said arm of said first pair of scissor arms moves along said first lead screw upon rotation of said first lead screw.

9. A device for presenting a cassette from within a pod to a transfer device of a processing station as recited in claim 8, wherein said elevator further comprises:

a second pair of scissor arms mounted on a second side of the device; and a second lead screw, an end of an arm of said second pair of scissor arms being mounted on said second lead screw such that said end of said arm of said second pair of scissor arms moves along said second lead screw upon rotation of said second lead screw, said ends of said arms of said first and second pairs of scissor arms moving along said first and second lead screws in unison.

10. A device for presenting a cassette from within a pod to a transfer device of a processing station as recited in claim 8, wherein said drive mechanism comprises a motor for rotating said first and second lead screws.

11. A device for presenting a cassette from within a pod to a transfer device of a processing station as recited in claim 1, wherein said elevator comprises a vertically oriented lead screw.

12. A device for presenting a cassette from within a pod to a transfer device of a processing station as recited in claim 11, wherein said outer support plate is cantelevered on said vertically oriented lead screw.

13. A device for presenting a cassette from within a pod to a transfer device of a processing station as recited in claim 1, wherein said elevator comprises a pneumatic lift.

14. A device for presenting a cassette from within a pod to a transfer device of a processing station as recited in claim 1, wherein said elevator comprises a hydraulic lift.

15. A device for presenting a cassette from within a pod to a transfer device of a processing station as recited in claim 1, wherein said inner support plate is stationarily mounted to said base.

16. A device for presenting a cassette from within a pod to a transfer device of a processing station as recited in claim 1, wherein said inner support plate is rotationally mounted to said base.

17. A device for presenting a cassette from within a pod to a transfer device of a processing station as recited in claim 1, wherein said work piece comprises a semiconductor wafer.

18. A device for presenting a cassette from within a pod to a transfer device of a processing station as recited in claim 1, wherein said work piece comprises a flat panel.

19. A device for presenting a cassette from within a pod to a transfer device of a processing station as recited in claim 1, wherein said work piece comprises a reticle.

20. A load port opener for transferring a cassette into a processing station, the load port having a front adjacent to the processing station and sides adjacent to the front, comprising:

an inner support plate capable of supporting the cassette;

an outer support plate circumjacent around the inner support plate;

a top, said outer support plate capable for supporting said top;

moving means affixed to the outer support plate for moving said outer support plate away from said inner support plate;

a telescopic cover defining a minienvironment under said outer support plate and said top and around the sides of the load port opener, said telescopic cover including a plurality of vertically oriented leaves, said telescopic cover capable of occupying a first, compact position in which said leaves substantially overlap each other, and a second, extended position in which said leaves do not substantially overlap each other;

a source of gas for providing a gas to said minienvironment;

wherein said gas passes from said minienvironment to an environment external to said minienvironment through spaces between adjacent leaves of said plurality of vertically oriented leaves; and an optical detector system mounted on an upper surface of said outer support plate and moving with said outer support plate, said optical detector system including:

a light source for emitting a light beam in a horizontal plane, said light source being split into at least a first portion and a second portion, a first sensor for receiving said first portion, said first sensor and said first portion being capable of indicating when the at least one work piece within the cassette resides in said horizontal plane, and a second sensor for receiving said second portion, said second sensor and said second portion being capable of indicating when the at least one work piece is not properly seated within the cassette.

21. A load port opener as recited in claim 20, further comprising a flap on one of said plurality of leaves, said flap capable of allowing said gas to flow out of said minienvironment but preventing flow of a gas into said minienvironment, said flap preventing a pressure within said minienvironment from exceeding a predetermined level.

22. A load port opener for allowing transfer of a cassette carrying at least one work piece between a processing station and an environment external to the processing station, the load port opener comprising:

a base;

an inner support plate for supporting the cassette, said inner support plate being mounted to said base;

an outer support plate circumjacent about said inner support plate, said outer support plate capable of vertical translation with respect to said base;

elevation means for vertically translating said outer support plate with respect to said base;

drive means for driving said elevation means;

a gas source for providing a gas to the environment;

a telescopic cover surrounding the load port opener on all sides except the side of the load port opener adjacent the processing station, said telescopic cover in part defining the environment, and said telescopic cover including a plurality of sections, a first section of said plurality of sections being affixed to a second section of said plurality of sections so that said first section is capable of moving with respect to said second section, said gas from said gas source capable of passing out of said environment through a space between said first and second sections;

a flap on one of said plurality of section of said telescopic cover, said flap capable of allowing said gas to flow out of the environment but preventing flow of a gas into the environment, said flap preventing a pressure within the environment from exceeding a predetermined level; and sensing means mounted in said outer support plate for sensing positional information of the work piece with respect to the cassette.

\* \* \* \* \*